United States Patent
Yew et al.

(10) Patent No.: US 6,251,783 B1
(45) Date of Patent: *Jun. 26, 2001

(54) METHOD OF MANUFACTURING SHALLOW TRENCH ISOLATION

(75) Inventors: Tri-Rung Yew, Hsien; Kuo-Tai Huang, Hsinchu; Gwo-Shii Yang, Hsinchu; Water Lur, Taipei, all of (TW)

(73) Assignee: United Microelectronics Corp. (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/189,847

(22) Filed: Nov. 12, 1998

(51) Int. Cl.⁷ .................................................. H01L 21/302
(52) U.S. Cl. .......................... 438/692; 438/693; 438/694
(58) Field of Search ................................... 438/689, 693, 438/692, 694, 435, 437, 296

(56) References Cited

U.S. PATENT DOCUMENTS

| | | | |
|---|---|---|---|
| 5,262,346 | * 11/1993 | Bindal et al. | 438/404 |
| 5,429,070 | * 7/1995 | Campbell et al. | 118/723 R |
| 5,459,096 | * 10/1995 | Venkatesan et al. | 438/437 |
| 5,482,894 | * 1/1996 | Havermann | 438/623 |
| 5,691,215 | * 11/1997 | Dai et al. | 437/44 |
| 5,851,899 | * 12/1998 | Weigand | 438/427 |
| 5,981,355 | * 11/1999 | Lee | 438/424 |

* cited by examiner

*Primary Examiner*—Benjamin L. Utech
*Assistant Examiner*—Lan Vinh
(74) *Attorney, Agent, or Firm*—Oblon, Spivak, McClelland, Maier & Neustadt, P.C.

(57) ABSTRACT

A method of manufacturing shallow trench isolation structures. The method includes the steps of depositing insulating material into the trench of a substrate to form an insulation layer. The substrate has a plurality of active regions, each occupying a different area and having different sizes. In addition, there is a silicon nitride layer on top of each active region. Thereafter, a photoresist layer is then deposited over the insulation layer. Next, a portion of the photoresist layer is etched back to expose a portion of the oxide layer so that the remaining photoresist material forms a cap layer over the recessed area of the insulation layer. Subsequently, using the photoresist cap layer as a mask, the insulation layer is etched to remove a portion of the exposed oxide layer, thereby forming trenches within the oxide layer. After that, the photoresist cap layer is removed. Finally, a chemical-mechanical polishing operation is carried out to polish the insulation layer until the silicon nitride layer is exposed.

10 Claims, 3 Drawing Sheets

METHOD OF MANUFACTURING SHALLOW TRENCH ISOLATION

BACKGROUND OF THE INVENTION

1. Field of Invention

The present invention relates to method of manufacturing shallow trench isolation (STI). More particularly, the present invention relates to a method of manufacturing shallow trench isolation that includes the use of a chemical-mechanical polishing (CMP) operation.

2. Description of Related Art

Chemical-mechanical polishing (CMP) is a method for providing global planarization during the fabrication of very large scale integration (VLSI) circuits or the higher-density ultra large scale integration (ULSI) circuits. Since CMP is the only method capable of providing the necessary planarization when the feature size is small, most manufacturers are now pooling research efforts to investigate methods of improving this technique.

As size of semiconductor devices continues to shrink, for example, to a line width of between 0.18 μm to 0.25 μm or even smaller (deep sub-half micron range), the performance of a CMP operation, especially in the planarization of an oxide layer above a shallow trench, is becoming increasingly important. However, in order to prevent the dishing of a polished oxide layer above a wide trench opening, a manufacturing method that utilizes a reverse tone mask followed by an etching back operation is deployed. The addition of a reverse tone mask and an etching back operation is capable of improving CMP uniformity.

In a conventional shallow trench isolation manufacturing operation, size of active regions varies tremendously. Therefore, the shallow trenches formed between those active regions may have various sizes. FIGS. 1A through 1D are schematic, cross-sectional views showing the progression of steps in a manufacturing process for fabricating a conventional shallow trench isolation structure by forming a reverse tone mask followed by a chemical-mechanical polishing operation.

First, as shown in FIG. 1A, a shallow trench 101 and active regions 102a/102b are formed in a substrate 100 using photolithographic and etching processes. Since the sizes of active region 102a and active region 102b are different, the size of each shallow trench 110 will be different as well. Furthermore, a silicon nitride layer 104 is also formed over the active regions 102a/102b. Thereafter, a layer of oxide is deposited to fill completely the shallow trenches 101 and cover the entire substrate 100, thereby forming an oxide layer 106. The oxide layer 106 can be formed using, for example, atmospheric pressure chemical vapor deposition (APCVD). Due to the presence of shallow trenches in the substrate 100, the upper surface of the oxide layer 106 has an undulating profile.

Next, as shown in FIG. 1B, a photoresist layer is formed over the oxide layer 106. Then, the photoresist layer is developed and etched using photolithographic method to form a reverse tone mask 108. This reverse tone mask 108 covers the shallow trenches 101 with an opening 110 exposing a portion of the substrate in the active region 102a, which occupies a larger surface area. In fact, the opening 110 forms a complementary region of the active region 102a.

Thereafter, as shown in FIG. 1C, the exposed oxide layer 106 above the active region 102a is etched using the reverse tone mask 108 as an etching mask. Consequently, a large portion of the oxide layer 106 above the active region 102a is removed resulting in the appearance of small bumps on the upper surface of the oxide layer 106 near the edge of the opening 110. Subsequently, the reverse tone mask 108 is removed.

Next, as shown in FIG. 1D, a chemical-mechanical polishing operation is carried out to remove a portion of the oxide layer 106 that lies above the shallow trenches 101 (FIG. 1B) using the silicon nitride layer 104 as a polishing stop layer. Eventually, the upper surface of the oxide layer 106a is level with the top surface of the silicon nitride layer 104.

One of the advantages of using a reverse tone mask to form shallow trench isolation structures includes the reduction of polishing time. Consequently, both productivity and window of tolerance in producing the isolation structures are increased. Furthermore, the reduction of polishing time can reduce the degree of over-polishing of the silicon nitride layer. Hence, dishing of the oxide layer resulting from chemical-mechanical polishing is minimized.

Nevertheless, the utilization of a reverse tone mask introduces one more processing step in the fabrication of shallow trench isolation structures. Therefore, production cost and degree of complexity are affected. Moreover, due consideration must be paid regarding the proper alignment of the reverse tone mask. If the reverse tone mask is not properly aligned, the opening within the mask exposes a portion of the oxide layer within the shallow trench. Therefore, when the oxide layer is subsequently etched, a portion of the oxide within the shallow trench is etched away, and grooves are formed. These grooves may intensify any kink effect within a wafer chip so that current may leak out from the grooves and result in a short-circuit. Hence, the yield of the silicon chip may be lowered.

In light of the foregoing, there is an urgent need to combat the problems caused by the use of a reverse tone mask in chemical-mechanical polishing so that the yield rate of devices can increase despite a reduction in line width.

SUMMARY OF THE INVENTION

Accordingly, the present invention provides a method of manufacturing shallow trench isolation structures that utilizes a photoresist cap layer together with an etching back operation to replace the conventional processing method of using a reverse tone mask. This method of manufacturing shallow trench isolation structures has the advantage of using a reverse tone mask but without the disadvantage of mask alignment problems because no extra mask is formed. Therefore, the method is capable of lowering production cost and reducing the complexity of processing.

To achieve these and other advantages and in accordance with the purpose of the invention, as embodied and broadly described herein, the invention provides a method of manufacturing shallow trench isolation structures. The method includes the steps of first depositing insulating material into the trench of a substrate to form an insulation layer. The substrate has a plurality of active regions each occupying a different area and having a different size, and each active region is covered on top by a silicon nitride layer. Thereafter, a photoresist layer is deposited over the insulation layer. Next, a portion of the photoresist layer is etched back to expose a portion of the oxide layer so that the remaining photoresist material forms a cap layer over the recessed areas of the insulation layer. Subsequently, using the photoresist cap layer as a mask, the insulation layer is etched to remove a portion of the exposed oxide layer, thereby forming trenches within the oxide layer. After that, the photoresist cap layer is removed. Finally, a chemical-mechanical polishing operation is carried out to polish the insulation layer until the silicon nitride layer is exposed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
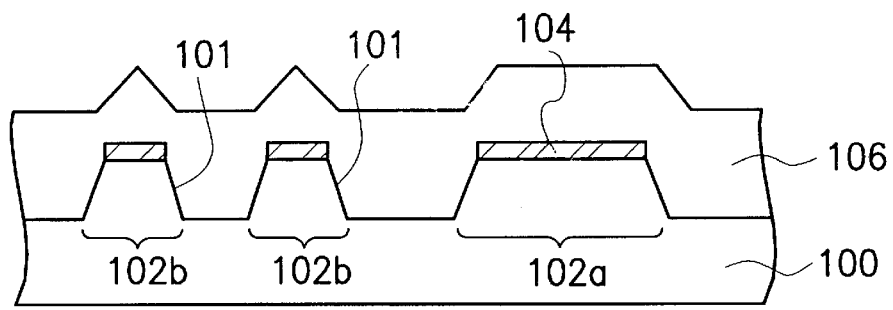
FIGS. 1A through 1D are schematic, cross-sectional views showing the progression of steps in a manufacturing process for fabricating a conventional shallow trench isolation structure by forming a reverse tone mask followed by a chemical-mechanical polishing operation.
Figure 1B:
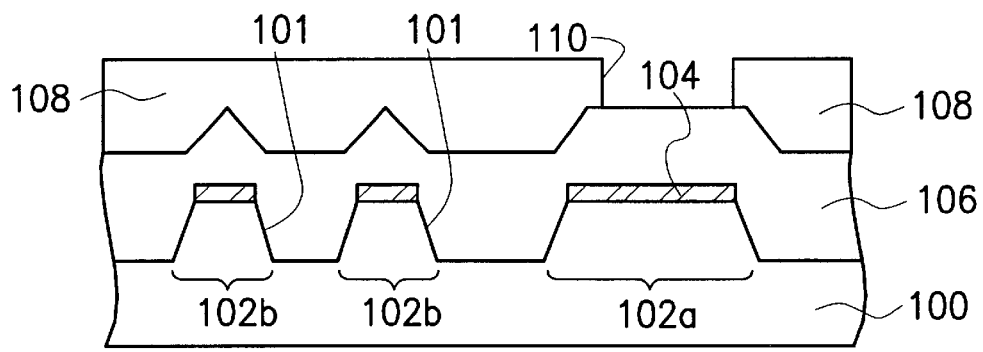
Figure 1C:
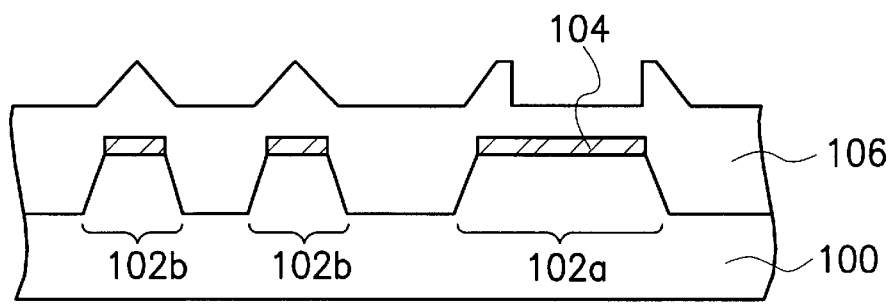
Figure 1D:
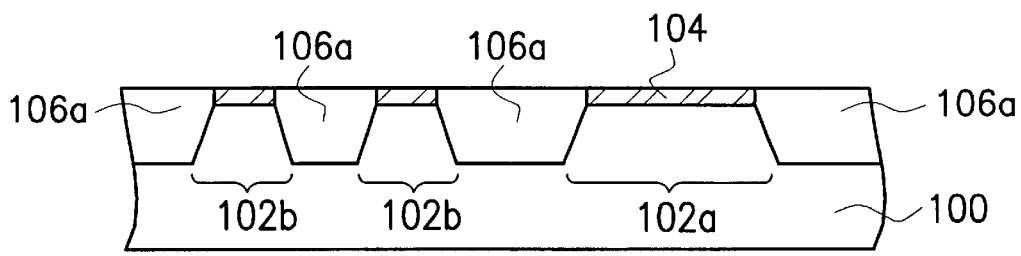

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views showing the progression of steps in a manufacturing process for fabricating a shallow trench isolation structure according to one preferred embodiment of this invention.

Figure 2A:
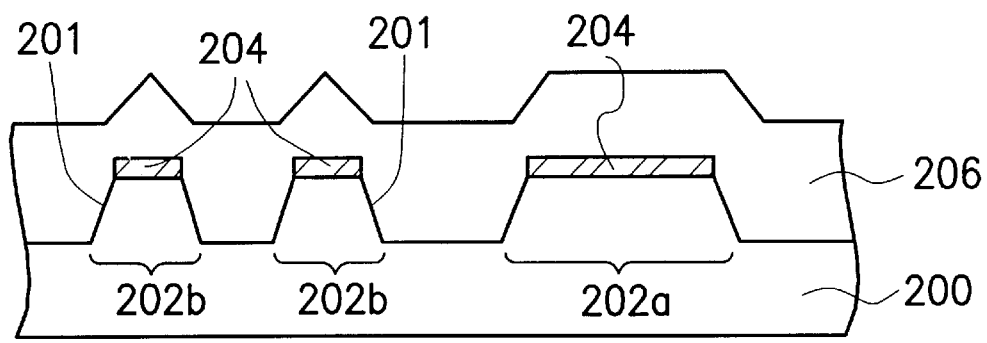
FIGS. 2A through 2E are schematic, cross-sectional views showing the progression of steps in a manufacturing process for fabricating a shallow trench isolation structure according to one preferred embodiment of this invention.

As shown in FIG. 2A, photolithographic and etching processes are carried out to form shallow trenches 201 and active regions 202a/202b in a substrate 200. The active region 202a and the active region 202b have different sizes, and hence each shallow trench 200 has a different size, as well. Furthermore, there is also a silicon nitride layer 204 over the active regions 202a/202b. In the next step, insulating material such as silicon dioxide is deposited into the trenches 201 and over the substrate 200 to form an insulation layer 206 using, for example, a high-density plasma chemical vapor deposition (HDPCVD) method. Consequently, the insulation layer 206 has an undulating upper surface with protrusions above the active regions 202a/202b. Moreover, the protrusions occupy a somewhat larger area where the active region is larger, as is active region 202a.

Figure 2B:
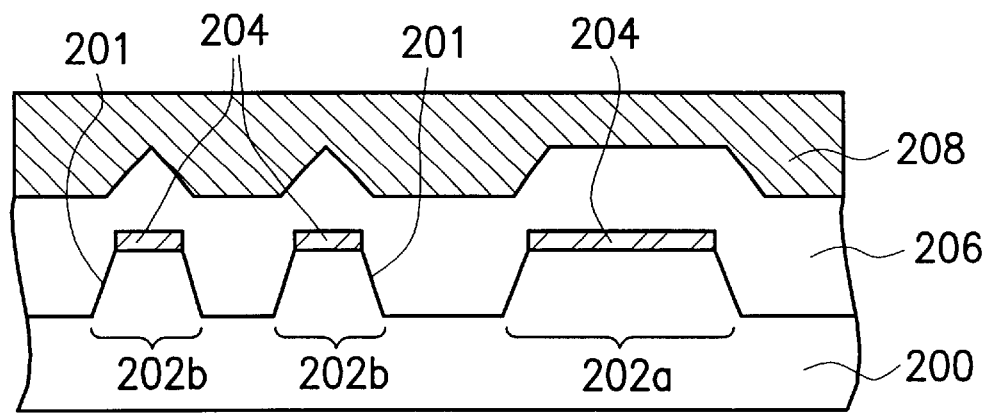

As shown in FIG. 2B, a photoresist layer 208 is formed over the insulation layer 206. The photoresist layer 208 must have a thickness sufficient for covering up the entire insulation layer 206, including its protruding portions. Since the photoresist layer 208 is formed by a coating operation, a planar upper surface is obtained.

Figure 2C:
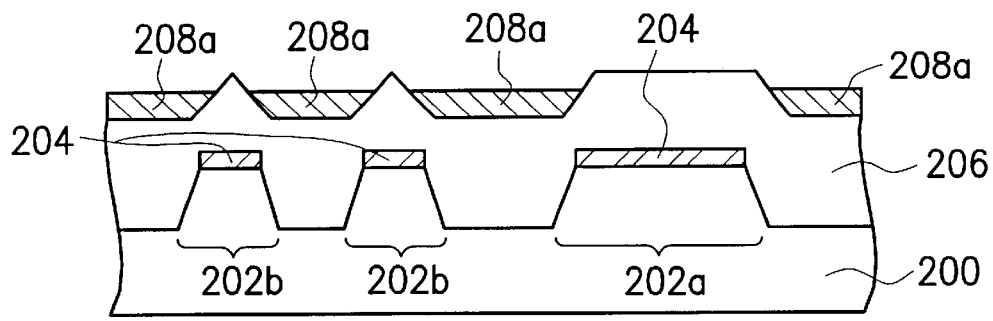

As shown in FIG. 2C, a portion of the photoresist layer 208 is removed using, for example, an etching back method. Ultimately, photoresist caps 208a are formed over the recessed portions of the insulation layer 206. These photoresist caps 208a all have an upper surface at a level slightly below that of the exposed insulation layer 206.

Figure 2D:
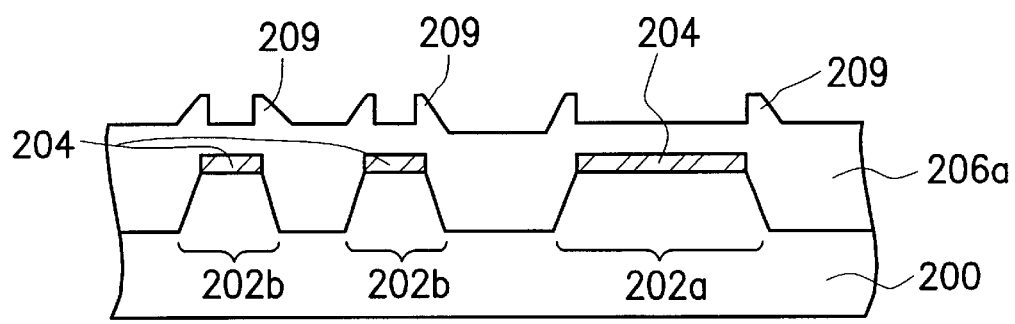

As shown in FIG. 2D, using the photoresist caps 208a as masks, a portion of the exposed insulation layer 206 is etched away to form recessed cavities (not shown in the figure) in the insulation layer 206. The above etching operation has a high etching selectivity ratio between the insulating material in the insulation layer 206 and the photoresist material in the photoresist cap 208a. Hence, the etching operation will remove the insulation layer 206 while the photoresist cap 208a is spared or etched just a little. The etching operation stops when the bottom part of the recessed cavities is at the lowest point of the insulation layer 206. Thereafter, the photoresist caps 208a are removed to produce a residual insulation layer 206a having tiny bumps 209 on top.

Figure 2E:
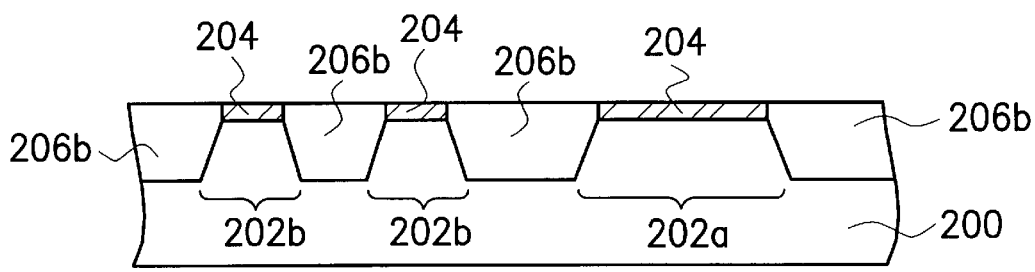

As shown in FIG. 2E, the insulation layer 206a above the shallow trench surface is removed using a chemical-mechanical polishing operation. The silicon nitride layer 204 serves as a polishing stop layer so that polishing stops when the silicon nitride layer 204 is exposed. Eventually, the upper surface of the silicon nitride layer 204 and the upper surface of the insulation layer 206b are both level with each other, thereby completing the fabrication process necessary for forming shallow trench isolation.

In the embodiment of this invention, an etching back operation is used to form photoresist caps over the recessed portions of an insulation layer, and then the photoresist caps are used as masks to replace the conventional reverse tone mask. Hence, this invention keeps the advantages of using a reverse tone mask and also reduces the amount of time spent in performing chemical-mechanical polishing. Consequently, productivity of a chemical-mechanical polishing machine and the window of tolerance for the processing operations are increased. Furthermore, a reduction of polishing time is able to reduce the formation of recessed cavities on the surface and damages.

In addition, the present invention saves one etching operation that requires a reverse tone mask, and the use of steppers and other associated equipment in photolithography for forming the reverse tone mask. Therefore, processing steps are simplified. Moreover, the photoresist caps provide a self-aligning function when the exposed insulation layer is etched. Consequently, there is no need to worry about problems resulting from a misalignment of the reverse tone mask, thus the yield rate of devices can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing shallow trench isolation structures, comprising:

providing a substrate having a plurality of active regions thereon, wherein the size of these active regions varies so that some active regions occupy a larger area while some other active regions occupy a smaller area, yet both small and large active regions are separated by shallow trenches;

depositing insulating material over the substrate to form an insulation layer which has convex portions and recessed portions corresponding to the shallow trenches;

forming a photoresist layer on the insulation layer;

etching back the photoresist layer to protrude the convex portions of the insulation layer above an upper surface of the photoresist layer, thereby forming photoresist caps on the recessed portions of the insulation layer;

removing a portion of the exposed insulation layer using the photoresist caps as masks so that a plurality of small bumps are formed above the remaining insulation layer;

removing the photoresist caps; and performing a chemical-mechanical polishing operation to remove a portion of the insulation layer until the substrate is exposed.

2. The method of claim 1, wherein the step of forming the insulation layer includes depositing silicon dioxide to form a silicon dioxide layer.

3. The method of claim 1 wherein the step of forming the insulation layer includes using a high-density plasma chemical vapor deposition method.

4. The method of claim 1, wherein the substrate further includes a polishing stop layer underneath the insulation layer.

5. The method of claim 4, wherein the polishing stop layer includes a silicon nitride layer.

6. A method of manufacturing shallow trench isolation structures, comprising:

providing a substrate that includes a first active region and a second active region separated from each other by shallow trenches, wherein a polishing stop layer covers both the first and the second active regions;

depositing insulation layer over the substrate, the insulation layer having convex portions and recessed portions corresponding to the shallow trenches;

forming a photoresist layer on the insulation layer;

removing a portion of the photoresist layer using an etching back operation to protrude the convex portions of the insulation layer above an upper surface of the photoresist layer, thereby forming photoresist caps on the recessed portions of the insulation layer;

removing a portion of the exposed insulation layer using the photoresist caps as masks, thereby forming a plurality of bumps above the remaining insulation layer;

removing the photoresist caps; and performing a chemical-mechanical polishing operation to remove the bumps and a portion of the insulation layer until the polishing stop layer is exposed.

7. The method of claim 6, wherein the step of forming the insulation layer includes depositing silicon dioxide to form a silicon dioxide layer.

8. The method of claim 6, wherein the step of forming the insulation layer includes using a high-density plasma chemical vapor deposition method.

9. The method of claim 6, wherein the step of forming the photoresist layer includes using a coating operation.

10. The method of claim 6, wherein the polishing stop layer includes a silicon nitride layer.

* * * * *